(12) United States Patent
Furusawa et al.

(10) Patent No.: US 6,599,830 B2
(45) Date of Patent: Jul. 29, 2003

(54) SEMICONDUCTOR DEVICE AND MANUFACTURING METHOD THEREOF

(75) Inventors: Takeshi Furusawa, Hino (JP); Takao Kumihashi, Mitaka (JP); Shuntaro Machida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/187,998

(22) Filed: Jul. 3, 2002

(65) Prior Publication Data

US 2002/0164865 A1 Nov. 7, 2002

Related U.S. Application Data

(62) Division of application No. 09/863,348, filed on May 24, 2001, now Pat. No. 6,479,380.

(30) Foreign Application Priority Data

May 25, 2000 (JP) .......................................... 2000-159545

(51) Int. Cl.⁷ .................... H01L 21/4763; H01L 21/302
(52) U.S. Cl. ........................ 438/638; 438/633; 438/637; 438/724; 438/757
(58) Field of Search ................................. 438/638, 633, 438/657, 724, 757, 929, 622, 626, 744, 791, 628, 642

(56) References Cited

U.S. PATENT DOCUMENTS

| | | | |
|---|---|---|---|
| 5,270,259 A | 12/1993 | Ito et al. ..................... 437/235 |
| 5,959,361 A | 9/1999 | Huang et al. ................ 257/774 |
| 6,051,508 A | 4/2000 | Takase et al. ................ 438/724 |
| 6,057,227 A | 5/2000 | Harvey ........................ 438/626 |
| 6,191,028 B1 | 2/2001 | Huang et al. ................ 438/633 |
| 6,225,217 B1 | 5/2001 | Usami et al. ................ 438/637 |
| 6,287,961 B1 | 9/2001 | Liu et al. ..................... 438/638 |
| 6,479,380 B2 * | 11/2002 | Furusawa et al. ........... 438/638 |
| 2001/0000155 A1 | 4/2001 | Huang et al. ................ 438/597 |

FOREIGN PATENT DOCUMENTS

| | | |
|---|---|---|
| JP | 1-319942 | 12/1989 |
| JP | 11-87502 | 3/1999 |

* cited by examiner

*Primary Examiner*—Michael S. Lebentritt
(74) *Attorney, Agent, or Firm*—Miles & Stockbridge P.C.

(57) ABSTRACT

To provide a method for manufacturing a semiconductor device, by which it is possible to form a trench or a hole with high aspect ratio on a methylsiloxane type film with low dielectric constant with causing neither via-connection failure nor short-circuit failure even when lower level interconnect is covered with etching stopper. The method comprises the processes of forming a layered film with a silicon oxide film on upper layer of a methylsiloxane type film and forming the layered film using a hard mask. When the etching stopper is etched, the silicon oxide film acts as a hard mask for the methylsiloxane type film, and transfer of faceting to the methylsiloxane type film is prevented. Thus, parasitic capacitance of multi-level interconnect can be reduced without causing via-connection failure and short failure.

38 Claims, 19 Drawing Sheets

SEMICONDUCTOR DEVICE AND MANUFACTURING METHOD THEREOF

CROSS-REFERENCE TO RELATED APPLICATION

This application is a division of U.S. application No. 09/863,348, now U.S. Pat. No. 6,479,380 filed May 24, 2001.

BACKGROUND OF THE INVENTION

1. Field of the Invention

The present invention relates to a semiconductor device provided with multi-level interconnects and a manufacturing method thereof.

In particular, the invention relates to a semiconductor integrated circuit device having multi-level interconnects with low parasitic capacitance and operated at high speed of several hundreds of MHz or more and a manufacturing method thereof.

2. Description of Related Art

In a semiconductor integrated circuit device operated at high speed of several hundreds of MHz or more, signal propagation delay due to parasitic capacitance in multi-level interconnects is significant.

FIG. 1 is a schematical plan view of multi-level interconnects. Reference numeral 1 denotes a semiconductor substrate, 4 a lower level interconnect, 14 a via, and 24 a higher level interconnect. Normally, adjacent level interconnects are laid out in directions crossing perpendicularly to each other. This means that the area to face each other is small between higher level and lower level interconnects. As a result, parasitic capacitance between adjacent interconnects in a level is generally larger than that between interconnects in different levels, and exert more influence on signal propagation delay. Accordingly, attempts have been made to reduce parasitic capacitance between the adjacent interconnects in a level by replacing the insulating film material (silicon oxide film (specific dielectric constant: k~4) and silicon nitride film (k~7)) between adjacent interconnects in a level with insulating film material with lower dielectric constant.

Methylsiloxane type film is one of the low dielectric constant film (k~about 3 or lower). This is a film having Si—CH$_3$ bond and Si—O—Si bond as main components. In addition, Si—H bond or Si—C—Si bond may be contained. There are the following methods to form the film: spin-coating and chemical vapor deposition (CVD). In the spin-coating, oligomer solution containing methylsiloxane (spin-on glass (SOG)) is deposited by spin-coating, and then is cured. In the CVD, a gas containing Si—CH$_3$ bond reacts with oxidizing gas in a CVD chamber. The advantageous feature of methylsiloxane type film is that it has high heat-resistant property and is stable in heat treatment (up to 450° C.) in the manufacturing process of multi-level interconnects.

However, when high-pressure oxygen plasma treatment is performed on methysiloxane type film, the film is deteriorated due to oxygen radicals in the plasma and absorbs moisture, and the quality of the film such as electrical characteristics is deteriorated. For this reason, conventional type patterning method cannot be used, in which a resist mask is removed by high-pressure oxygen plasma treatment after transferring the pattern.

A first method to solve this problem is disclosed in Japanese Patent Application 151102/1988, which describes the use of low-pressure oxygen plasma to remove the resist. According to this method, deterioration of the quality of methylsiloxane type film is suppressed. This is because oxygen ions in the low-pressure oxygen plasma modify the surface of the methylsiloxane type film to fine silicon oxide, and this surface layer protects inner part of the film from oxygen radicals.

There is a second method to prevent deterioration of the quality when the resist is removed, and this is disclosed in JP-A-87502/1999. It is a method to transfer resist pattern to hard mask, and after removing the resist in advance, the methylsiloxane type film is etched using the hard mask.

FIG. 2 to FIG. 4 each represents a cross-sectional view showing of a manufacturing process to explain the second method. On a methylsiloxane type film 6, a hard mask material 8 such as silicon nitride is deposited. A silicon oxide film 27, and further, a resist 9 are formed on it, and the resist is patterned by lithography (FIG. 2). After etching the silicon oxide film 27 using the resist mask 9, the resist 9 is removed (FIG. 3). In this case, the methylsiloxane type film 6 is covered with the hard mask material 8, and it is not exposed to oxygen plasma, and hence, it is not deteriorated. After transferring the pattern to the hard mask 8, the silicon oxide film 27 is removed. Then, using the hard mask 8, the methylsiloxane type film 6 is patterned (FIG. 4).

According to the first method as described above, it is not possible to form a hole pattern or a trench pattern with high aspect ratio (depth over diameter or depth over trench width). When the aspect ratio increases, the number of ions impinging on the pattern side-wall surface is decreased. As a result, surface passivation layer is not formed on the methylsiloxane type film and its quality is deteriorated. In practical application, this method is effective only in the case where the aspect ratio <3.

When the methylsiloxane type film is fabricated by the second method as described above, shoulder portion of the hard mask 8 collapses diagonally as shown in FIG. 4 (faceting). In case low resistance copper wire is used as the lower level interconnect 4, an etching stopper 5 on the surface of the interconnect must be etched (FIG. 5). As the etching stopper 5, silicon nitride film, silicon carbide film, etc. are used. Under the etching condition to etch the etching stopper 5, both the hard mask 8 and the methylsiloxane type film 6 are etched at the similar rate as the etching stopper 5. As a result, faceting of the hard mask 8 occurs more remarkably (FIG. 6). When there is a portion where the hard mask 8 completely disappears, faceting occurs on the methylsiloxane type film 6 underneath. Further, the faceting is expanded in argon sputter-etching, which is performed as pre-treatment (cleaning) of the next metal deposition (FIG. 7).

The first problem caused by the faceting is that sputtered dielectrics 98 are deposited on pattern bottom in case of argon sputter-etching, and this results in via-connection failure. The faceting prior to the sputter-etching increases the amount of the sputtered dielectrics, so increases the via-connection failure.

The second problem caused by the faceting is that buried metals 14 in the pattern are not completely separated from each other, and this causes short-circuit failure (FIG. 8).

SUMMARY OF THE INVENTION

It is an object of the present invention to provide a semiconductor device and a manufacturing method thereof, by which it is possible to form a trench or a hole with high aspect ratio on a methylsiloxane type film with low dielectric constant without causing via-connection failure and short circuit failure due to faceting even when lower level interconnects are covered with etching stopper.

According to an aspect of the method for manufacturing a semiconductor device of the present invention, inter-level dielectrics for forming holes for vias or trenches for interconnects are fabricated as layered films of a methylsiloxane type film and a different insulating film formed on the film, and the layered films are processed using a hard mask. As a result, hole pattern or trench pattern is transferred to the hard mask using a resist, and the resist is then removed. In this case, deterioration of the quality of the methylsiloxane type film can be prevented because the methylsiloxane type film is covered with the insulating film.

Also, when a hole or a trench is formed on the layered films, it is possible to prevent transfer of the faceting of the hard mask to the methylsiloxane type film because the insulating film is formed between the methylsiloxane type film and the hard mask. Thus, the first and the second problems as described above can be overcome. By setting the etching rate of the insulating film to ⅓ or less of that of the hard mask, the insulating film acts as a hard mask for the methylsiloxane type film, and the higher effects can be obtained. As an example of the material for the insulating film, it is effective to use silicon oxide film because it can suppress the increase of parasitic capacitance between the interconnects.

Further, in case the dual damascene process in which holes for vias or trenches for interconnects are formed at the same time, layered films of methylsiloxane type film, a different insulating film and a hard mask are deposited on the similar layered films, and then the hole and the trench are formed at the same time. In this case, the insulating film prevents quality deterioration caused by removal of the resist on the methylsiloxane type film under the insulating film, and also the transfer of the faceting of the hard mask to the methylsiloxane type film can be prevented. In case of the dual damascene process in which trench pattern is transferred to the higher level hard mask and hole pattern is transferred to the lower level hard mask, the resist used for patterning of the lower level hard mask is removed by low-pressure oxygen plasma treatment, and quality deterioration of the methylsiloxane type film formed on the lower level hard mask can be suppressed.

In case the etching stopper is formed on the lowermost layer of the inter-level dielectrics, the hard mask on the exposed portion is removed at the same time when the hole is formed on the etching stopper. As a result, it is possible to reduce parasitic capacitance between the multi-level interconnects.

According to an aspect of a semiconductor device of the present invention, inter-level dielectrics with dual damascene interconnects formed on it are made as layered films comprising a first methylsiloxane type film, a first insulating film, a hard mask, a second methylsiloxane type film, and a second insulating film in this order from below, and the manufacturing method as described above can be applied. The decrease of production yield caused by via-connection failure or short-circuit failure of multi-level interconnects can be prevented, and a semiconductor integrated circuit device to be operated at high speed of several hundreds of MHz or more can be manufactured at lower cost.

Other and further objects, features and advantages of the invention will appear more fully from the following description.

BRIEF DESCRIPTION OF THE DRAWINGS

A preferred form of the present invention illustrated in the accompanying drawings in which.

DETAILED DESCRIPTION OF THE PREFERRED EMBODIMENT

Example 1

FIG. 9 to FIG. 20 each represents a cross-sectional view or a plan view of a process for manufacturing a first embodiment of a semiconductor device of the present invention, in which single damascene process is applied for forming multi-level interconnects.

Figure 1:
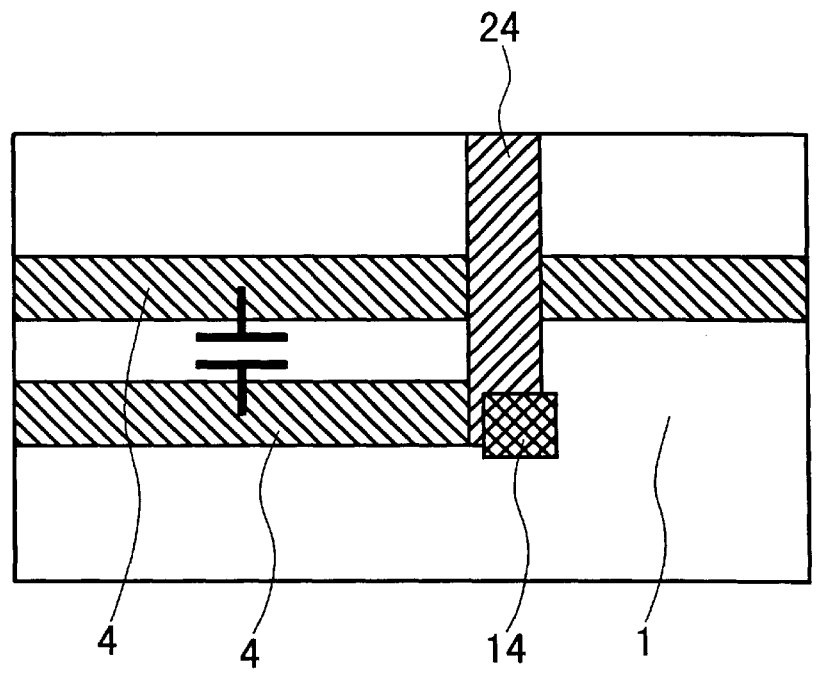
FIG. 1 is a schematical plan view of conventional type multi-level interconnects.
Figure 2:
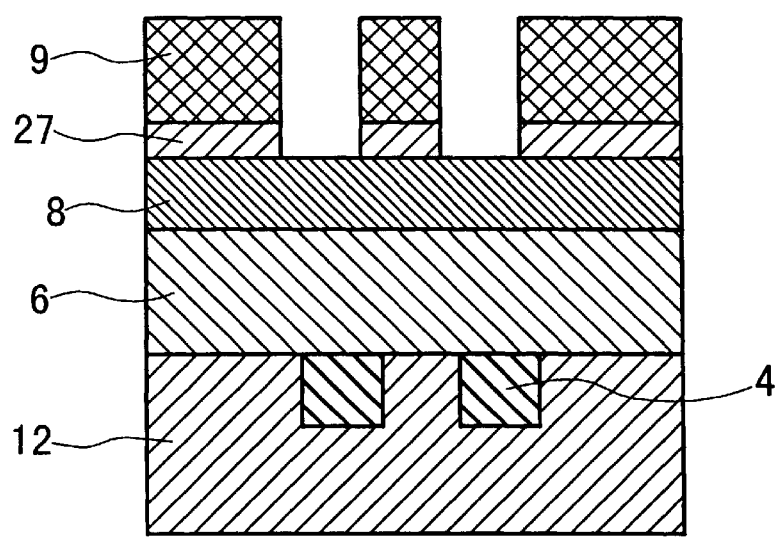
FIG. 2 is a cross-sectional view showing a process for manufacturing conventional type multi-level interconnects.
Figure 3:
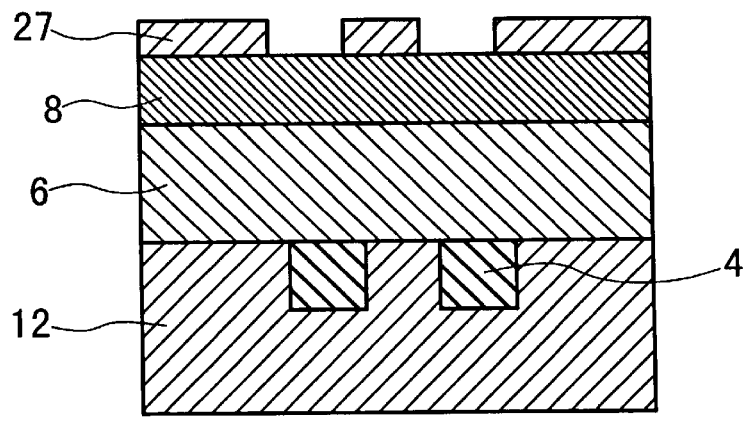
FIG. 3 is a cross-sectional view showing a process for manufacturing conventional type multi-level interconnects.
Figure 4:
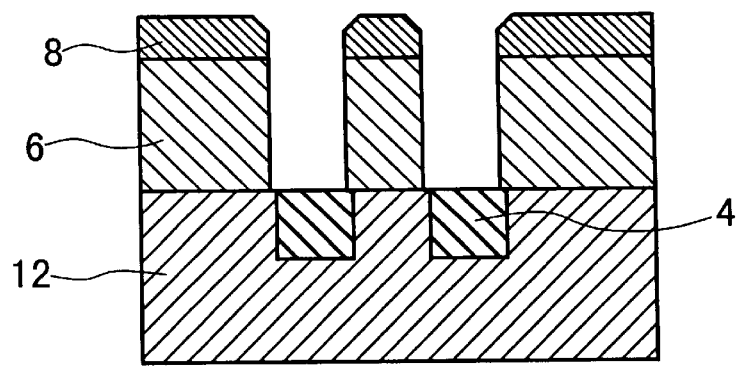
FIG. 4 is a cross-sectional view showing a process for manufacturing conventional type multi-level interconnects.
Figure 5:
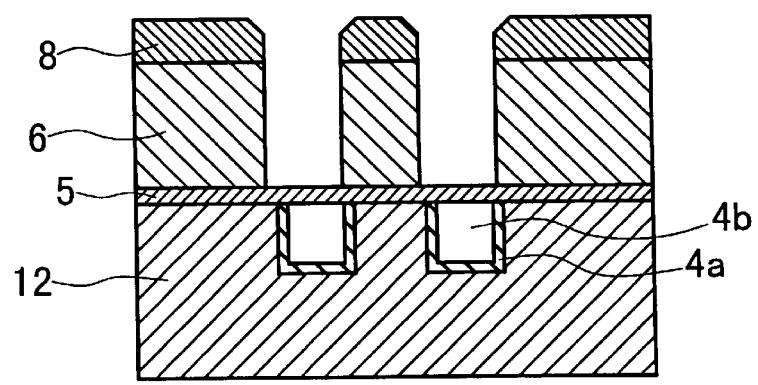
FIG. 5 is a cross-sectional view showing a manufacturing process to explain problems in the conventional example.
Figure 6:
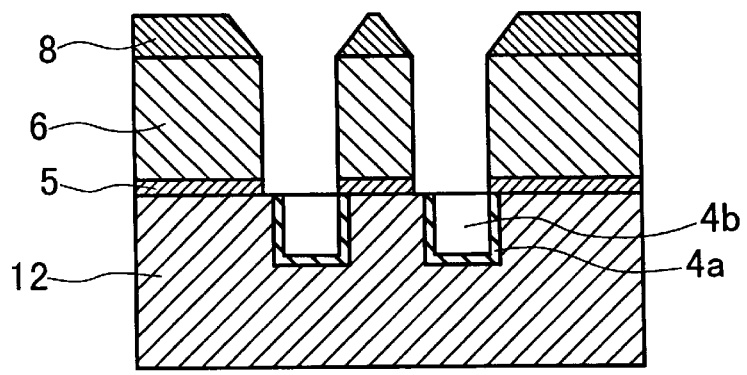
FIG. 6 is a cross-sectional view showing a manufacturing process to explain problems in the conventional example.
Figure 7:
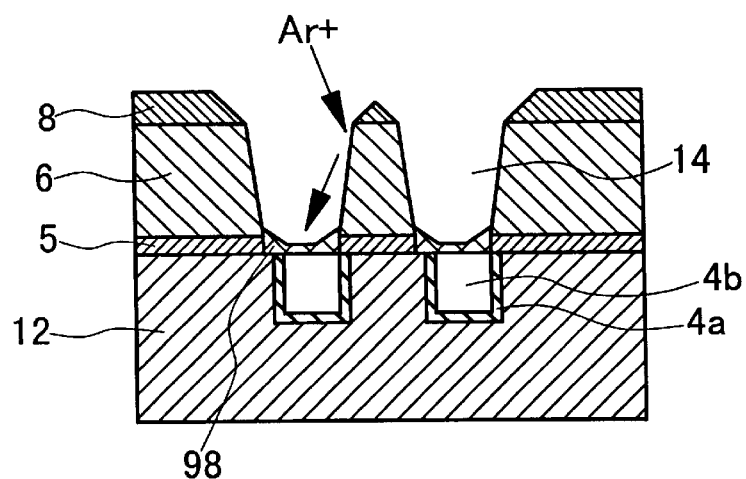
FIG. 7 is a cross-sectional view showing a manufacturing process to explain problems in the conventional example.
Figure 8:
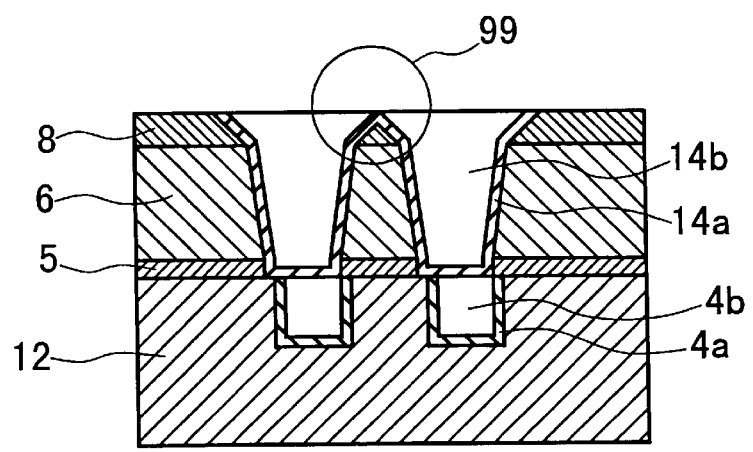
FIG. 8 is a cross-sectional view showing a manufacturing process to explain problems in the conventional example.
Figure 9:
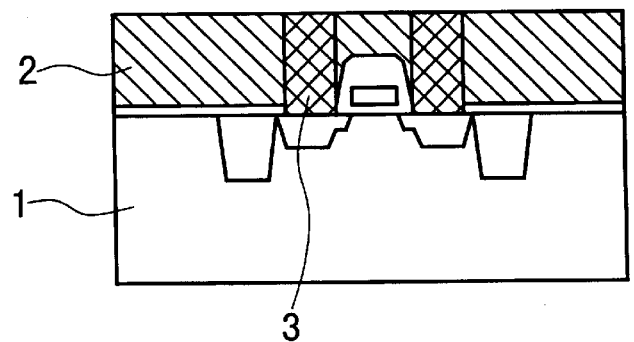
FIG. 9 is a cross-sectional view of a manufacturing process of a first embodiment of the present invention.

As shown in FIG. 9, a first inter-level dielectric film 2 is formed on a silicon substrate 1 where a device component is fabricated. Then, a contact hole is opened, and titanium nitride is buried by CVD method. By chemical-mechanical polishing, the metal outside the hole is removed, and a contact plug 3 is formed. In the figure, a MOS transistor is shown as a device component.

Figure 10:
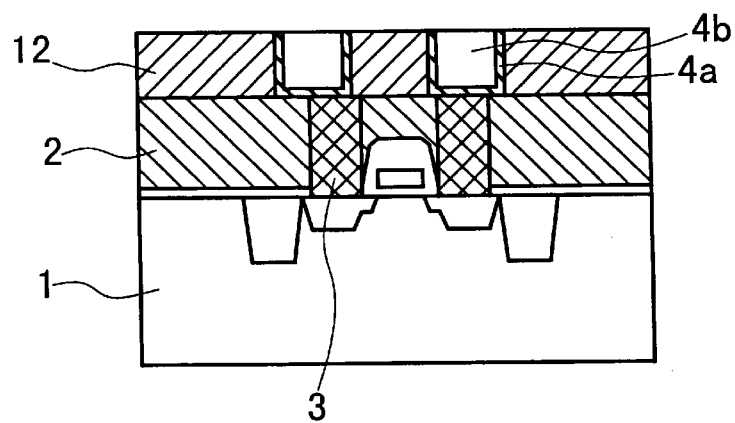
FIG. 10 is a cross-sectional view of a manufacturing process of a first embodiment of the present invention.
Figure 11:
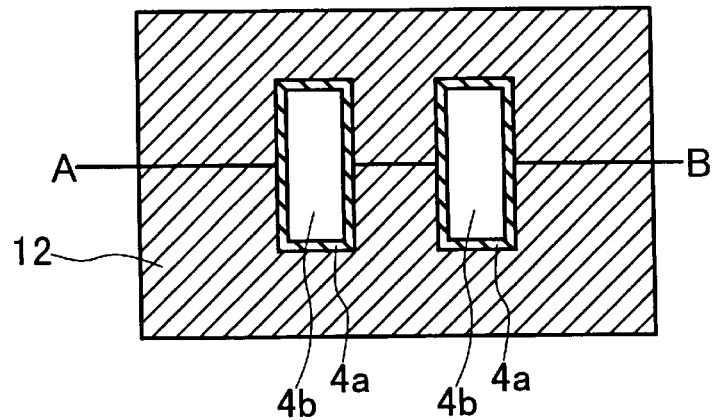
FIG. 11 is a cross-sectional view of a manufacturing process of a first embodiment of the present invention.

Next, as shown in FIG. 10, a second inter-layer dielectric 12 is formed, and a trench for a first level interconnect is fabricated. Sputter-etching is performed for the time as long as a 20-nm-thick blanket silicon oxide film is removed. Titanium nitride and copper are thinly formed by sputtering. Further, copper plating is performed to bury the trench with layered films of a barrier metal film 4a comprising titanium nitride and a copper film 4b. Further, by chemical-mechanical polishing, titanium nitride and copper outside the trench were removed, and first-level interconnects 4a and 4b were formed. A plan view of the process in this stage is shown in FIG. 11. Here, FIG. 10 is a cross-sectional view along the line A–B in FIG. 11. The relationship between this cross-sectional view and the top view is the same in the description given below.

Figure 12:
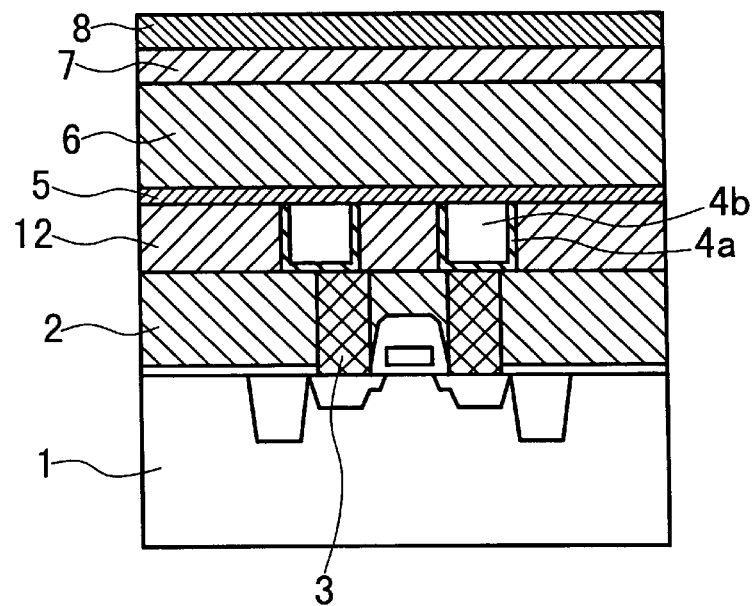
FIG. 12 is a cross-sectional view of a manufacturing process of a first embodiment of the present invention.

Next, as shown in FIG. 12, a silicon nitride film was formed in thickness of 50 nm by plasma CVD method as an etching stopper 5 of the first level interconnect. Then, 300-nm-thick organic SOG film was coated as a methylsiloxane type film 6, and this was cured in nitrogen ambient at 425° C. Further, by plasma CVD method, a silicon oxide film 7 was formed in thickness of 100 nm, and a silicon nitride film 8 was formed in thickness of 100 nm as a hard mask 8.

Figure 13:
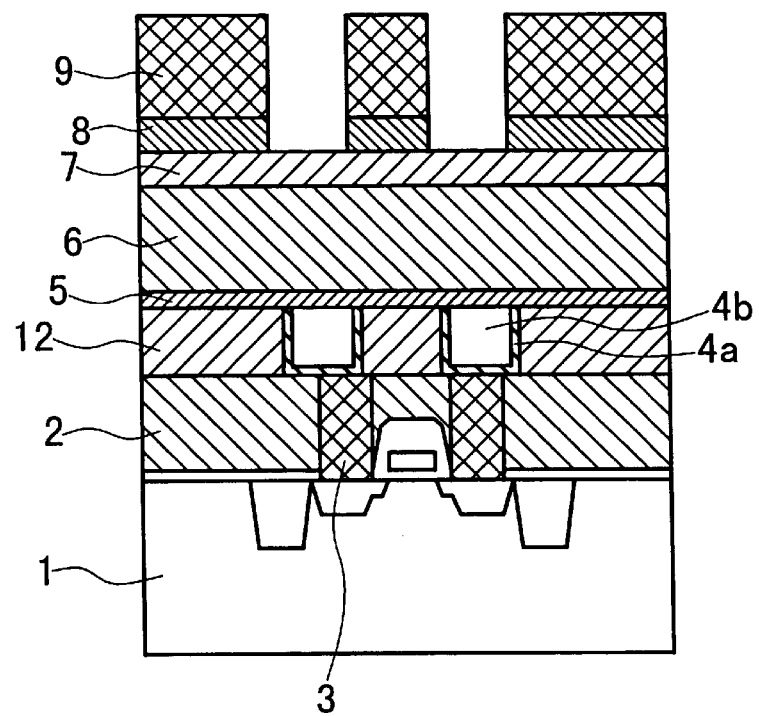
FIG. 13 is a cross-sectional view of a manufacturing process of a first embodiment of the present invention.

Next, as shown in FIG. 13, reactive ion etching was performed using a resist 9 as mask, and via pattern was transferred from the resist 9 to the hard mask 8. In this etching process, it is necessary to stop the etching at the silicon oxide film 7 without exposing the lower level organic SOG film as shown in the plan view of FIG. 14. There is no need to stop the etching exactly at the upper surface of the silicon oxide film 7 as shown in FIG. 13, and there is no problem even when the silicon oxide film is etched to some extent.

Figure 15:
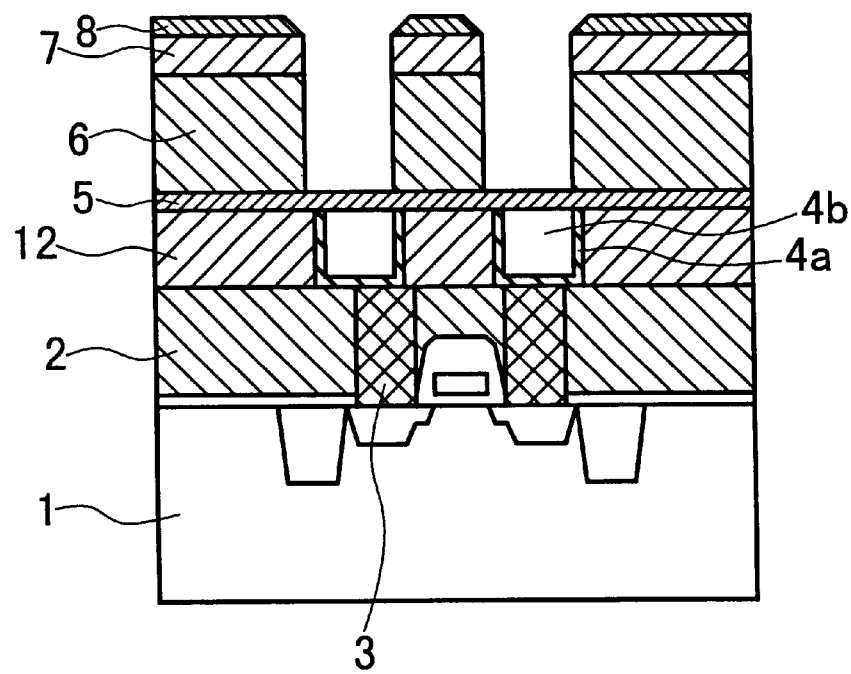
FIG. 15 is a cross-sectional view of a process for manufacturing the first embodiment of the present invention.

Then, as shown in FIG. 15, the resist 9 was removed by ICP type asher, and reactive ion etching was performed using the silicon nitride film 8 as hard mask, and etching was performed on the silicon oxide film 7 and the organic SOG film 6. In this etching process, etching selectivity or selection ratio of the silicon oxide and the organic SOG film to the silicon nitride was 10. By this etching process, film thickness of the hard mask was turned to 60 nm.

Figure 16:
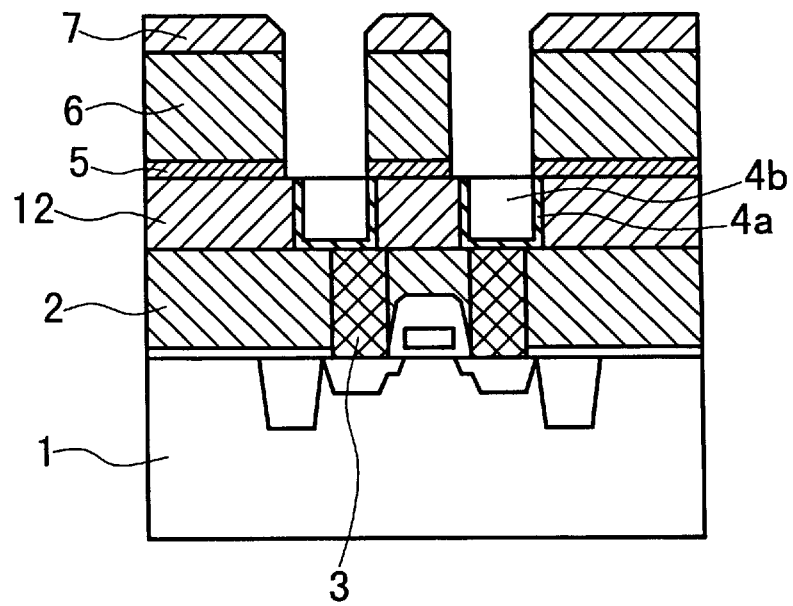
FIG. 16 is a cross-sectional view of a process for manufacturing the first embodiment of the present invention.

Next, as shown in FIG. 16, the space inside the hole was cleaned using wet solution, and the etching stopper 5 was removed by etching, and upper surface of the first level interconnects 4a and 4b were exposed. In this case, almost the entire hard mask on upper portion of the pattern disappeared. When the upper surfaces of the first level interconnects 4a and 4b were exposed, the hard mask 8 may remain. However, it is preferable to remove it in the etching process by over-etching in order to reduce parasitic capacitance between interconnects.

Figure 17:
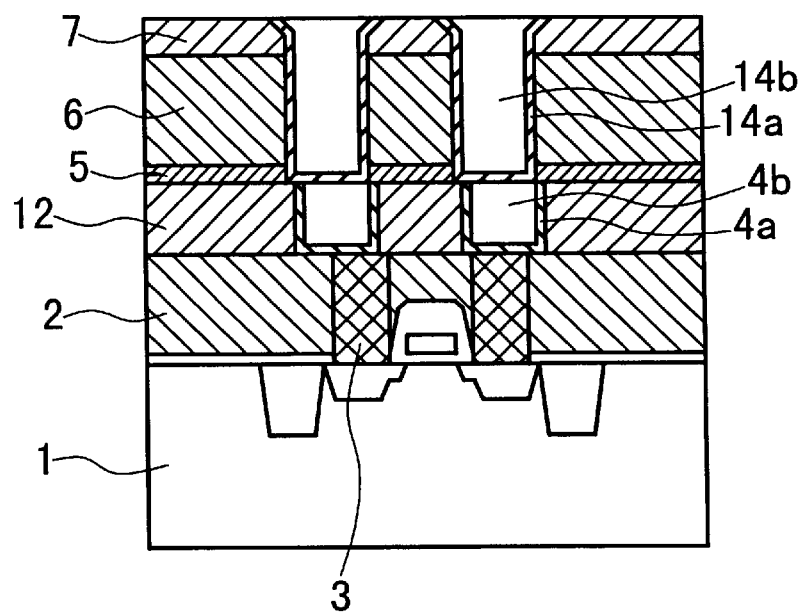
FIG. 17 is a cross-sectional view of a process for manufacturing the first embodiment of the present invention.
Figure 18:
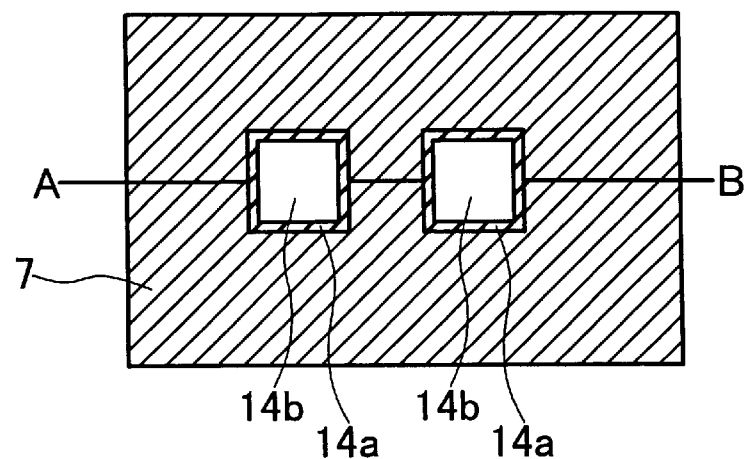
FIG. 18 is a plan view of a process for manufacturing the first embodiment of the present invention.

Further, as shown in FIG. 17, sputter-etching was performed for the time as long as a 20-nm-thick blanket silicon oxide film is removed, and titanium nitride and copper were thinly formed by sputtering. Then, by copper plating, layered films of the barrier metal film 4a comprising titanium nitride and the copper film 4b was buried in the hole. Further, by chemical-mechanical polishing, titanium nitride and copper were removed, and vias 14a and 14b were formed. A plan view of the process in this stage is shown in FIG. 18.

Figure 19:
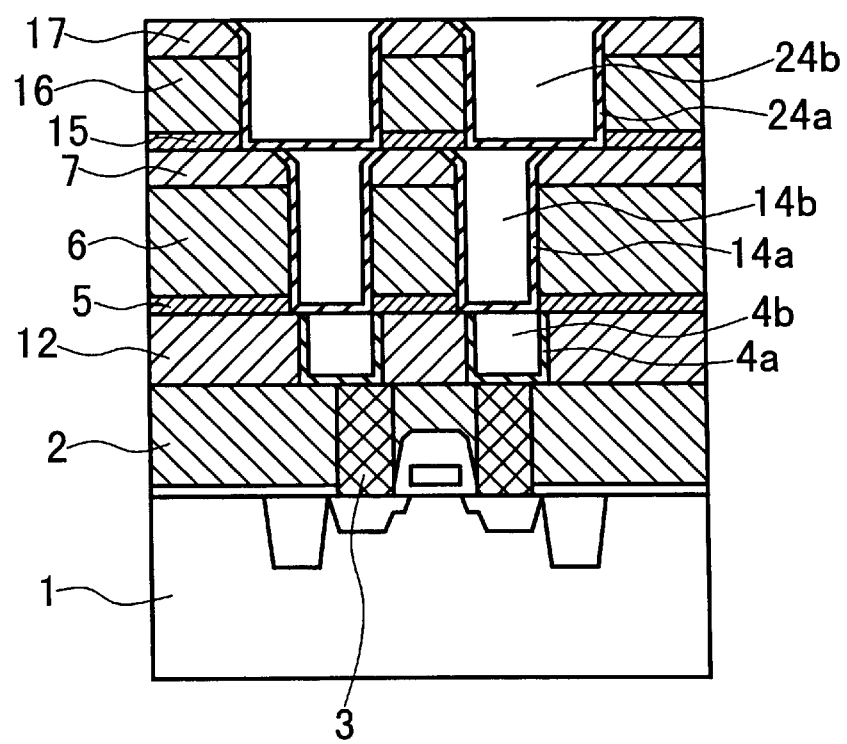
FIG. 19 is a cross-sectional view of a process for manufacturing the first embodiment of the present invention.
Figure 20:
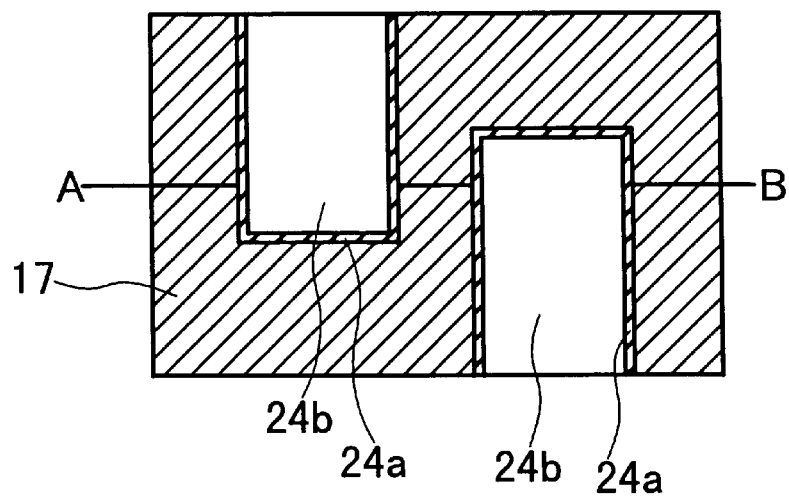
FIG. 20 is a plan view of a process for manufacturing the first embodiment of the present invention.

Then, as shown in FIG. 19, the procedure of FIG. 12 to FIG. 18 was repeated, and second level interconnects 24a and 24b were formed. Reference numeral 15 denotes a silicon nitride film as an etching stopper, 16 is an organic SOG film as methylsiloxane type film, 17 a silicon oxide film, 24a titanium nitride used as barrier metal film, and 24b a copper layer. A plan view of the process in this stage is shown in FIG. 20. This process is different from the process shown in FIG. 12 to FIG. 18 in that film thickness of the organic SOG film 16 is as thin as 200 nm and that hole pattern of vias is changed to trench pattern of the second level interconnects.

In the semiconductor device of Example 1 as formed above, yield of the multilevel interconnects was evaluated. As a result, via connection yield of 0.25 µm diameter vias and insulation yield of 0.25 µm spacing interconnects were both 95% or more, and no decrease of yield due to faceting was observed.

Further, the process from FIG. 12 to FIG. 20 of Example 1 was repeated, and 3-level interconnects were formed, and capacitance between adjacent wires of the second level interconnects was measured. Effective dielectric constant between the adjacent wires thus obtained was 3.3.

In the above Example, silicon nitride film was used as hard mask, but this may contain Si—H bond in addition to the main component. Also, the film may replace silicon carbide film or may contain Si—H bond or Si—CH$_3$ bond in addition to the main component of silicon carbide film.

In the above Example, the organic SOG film was used as methylsiloxane film, while Si—H bond or Si—C—Si bond may be contained in addition to the main components of Si—CH$_3$ bond and Si—O—Si bond. Also, the film may be formed by CVD method instead of coating method. Or, oligomer solution mixed with organic polymer may be coated in advance, and organic polymer may be decomposed and removed by curing, and low density organic SOG thus prepared may be used.

The materials of the hard mask and methylsiloxane film are the same in the examples as described below.

Figure 21:
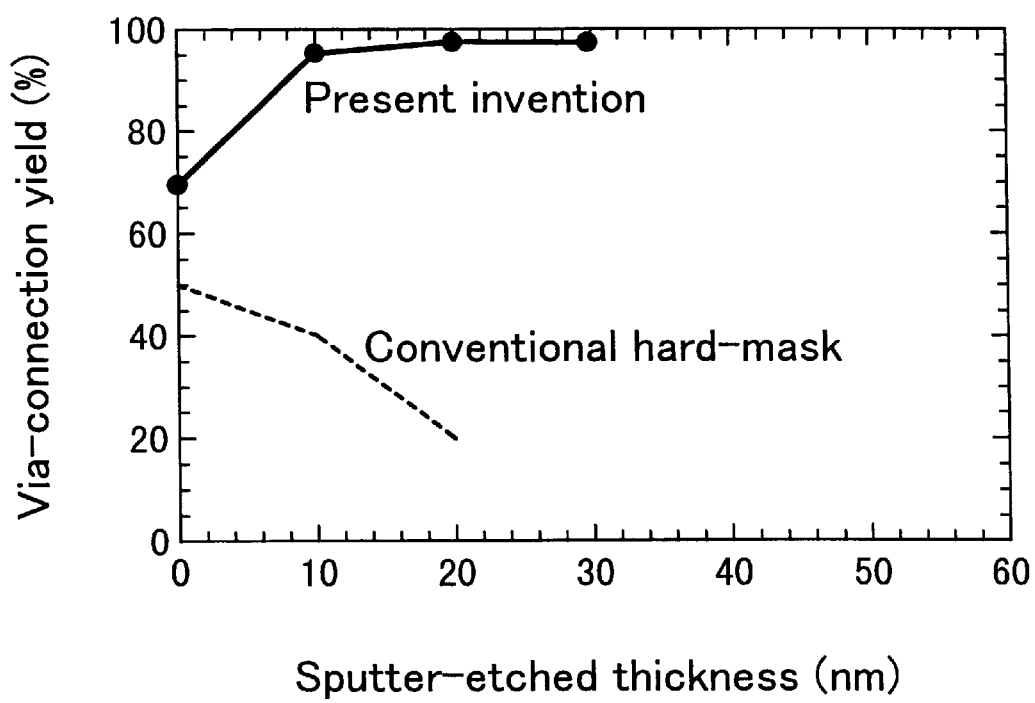
FIG. 21 is a diagram showing relationship between sputter-etched thickness before deposition of vias and interconnects and via-connection yield of vias.

The effect of sputter-etching length is shown in FIG. 21. Here, the samples were the same as that shown above except for the length of sputter-etching. The sputter-etching length is represented by the sputter-etched thickness, which is the decrease in thickness when the sputter-etching for the same length is applied to a blanket silicon-oxide film.

Example 2

FIG. 22 to FIG. 27 each represents a cross-sectional view or a plan view of a manufacturing process of a semiconductor device in Example 2 of the present invention where dual damascene process is applied for formation of multi-level interconnects. In this Example, the process from FIG. 9 to FIG. 14 is the same as in Example 1.

Figure 22:
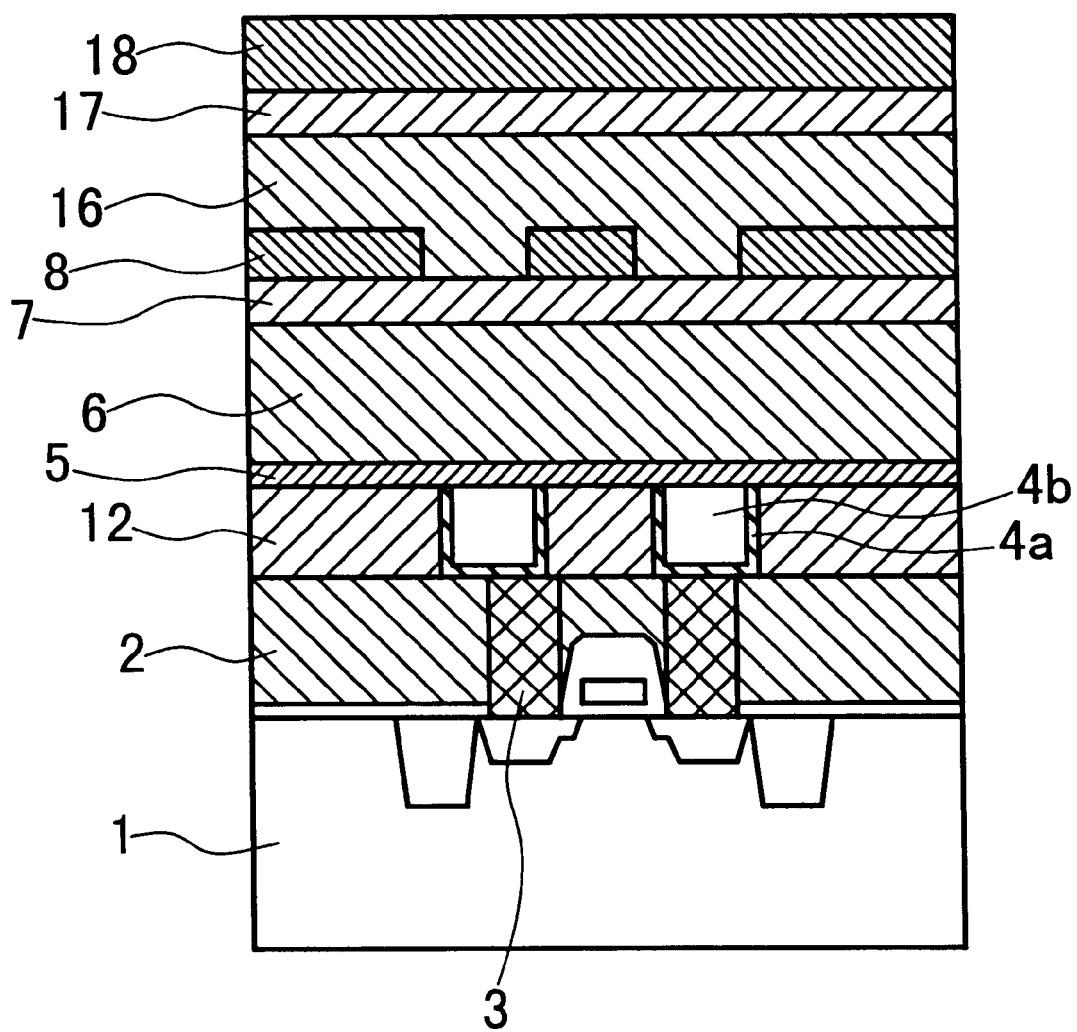
FIG. 22 is a cross-sectional view of a process for manufacturing a second embodiment of the present invention.

After the process of FIG. 13, the resist 9 was removed as shown in FIG. 22. A second organic SOG film was coated as a methylsiloxane film 16 in thickness of 200 nm, and this was cured under nitrogen ambient at 425° C. Further, a second silicon oxide film 17 was formed in thickness of 100 nm by plasma CVD method, and a silicon nitride film was formed in thickness of 150 nm as a second hard mask 18.

Figure 23:
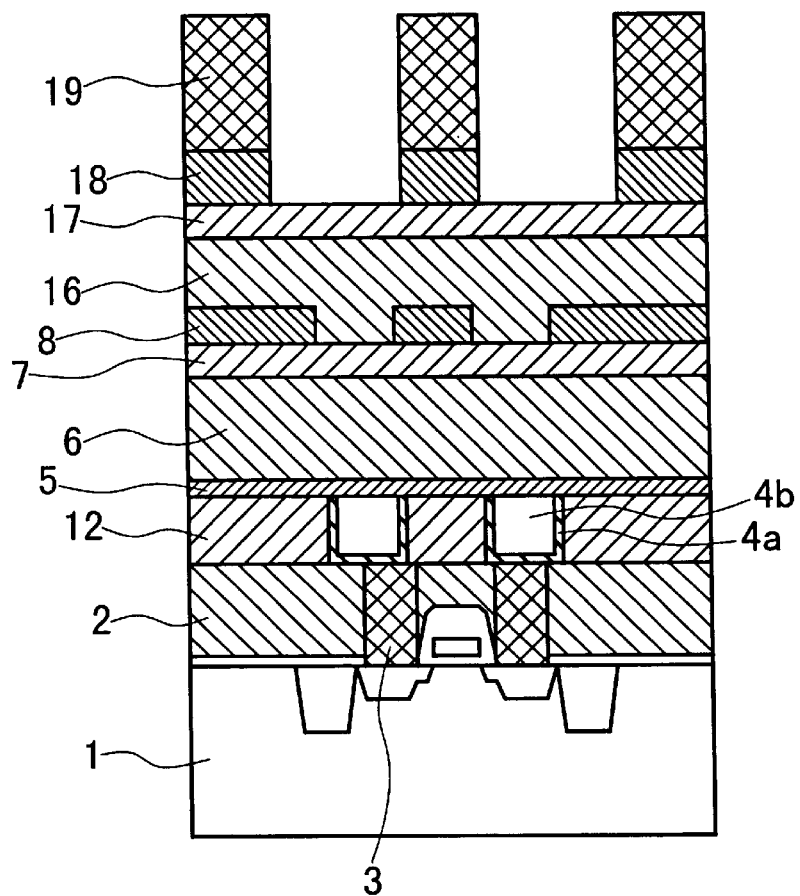
FIG. 23 is a cross-sectional view of a process for manufacturing the second embodiment of the present invention.
Figure 24:
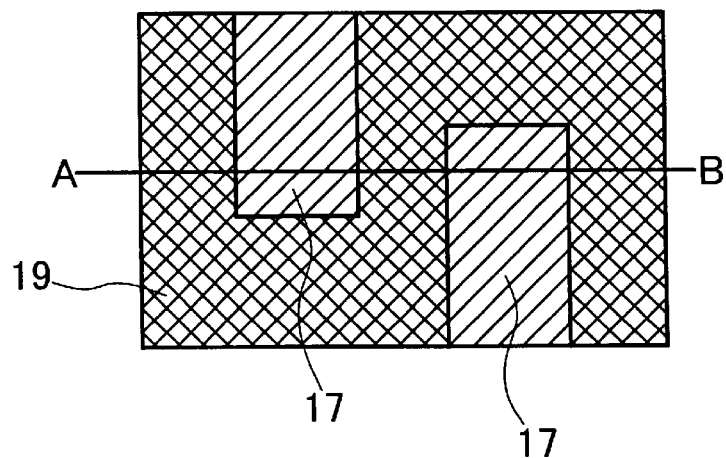
FIG. 24 is a cross-sectional view of a process for manufacturing the second embodiment of the present invention.

Next, as shown in FIG. 23, reactive ion etching was performed using a second resist 19 as mask, and the second level interconnect pattern was transferred to the second hard mask 18. In this etching process, it is necessary to stop the etching in the second silicon oxide film 17 without exposing lower level second organic SOG film 16 as shown in the plan view of FIG. 24. There is no need to stop the etching exactly on the upper surface of the second silicon oxide film 17 as shown in FIG. 23. The second silicon oxide film may be etched if the second organic SOG film 16 is not exposed.

Figure 25:
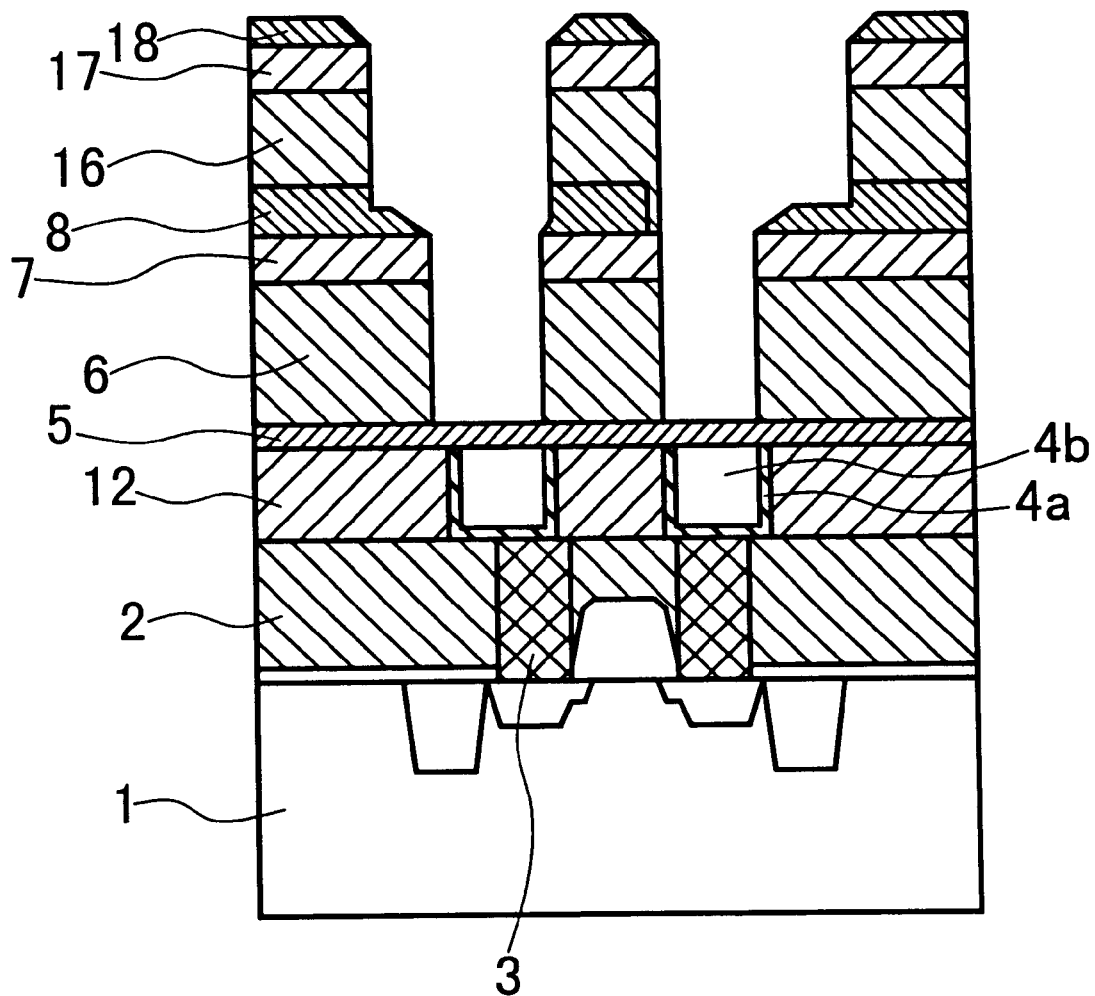
FIG. 25 is a cross-sectional view of a process for manufacturing the second embodiment of the present invention.

Next, as shown in FIG. 25, the resist 19 was removed by ICP type asher, and reactive ion etching was performed using the second silicon nitride film 18 and the first silicon nitride film 8 as hard masks, and etching was performed on the first silicon oxide film 7 and the second silicon oxide film 17 as well as the first organic SOG film 6 and the second organic SOG film 16. In this etching process, etching selectivity of the silicon oxide and the organic SOG to silicon nitride was 10. By this etching process, film thickness of the exposed portion of each of the first hard mask 8 and the second hard mask 18 was turned to 60 nm. As a result, via holes were formed in the layered film of the first organic SOG film 6 and the first silicon oxide film 7. Also, a trench for the second level interconnect was formed in the layered film of the second organic SOG film 16 and the second silicon oxide film 17.

Figure 26:
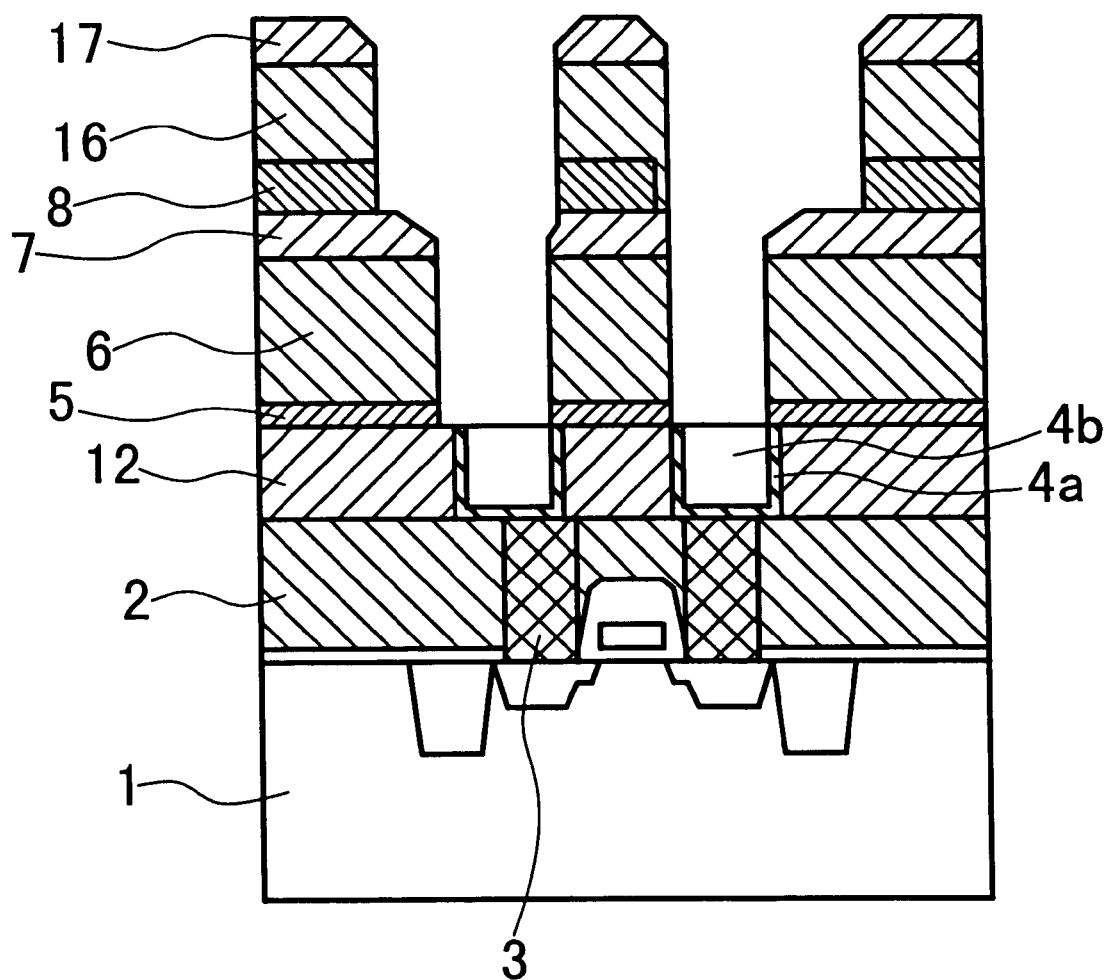
FIG. 26 is a cross-sectional view of a process for manufacturing the second embodiment of the present invention.

Next, as shown in FIG. 26, the spaces in the hole and the trench were cleaned using wet solution, and etching was performed on the etching stopper 5. In this case, exposed portions of the first hard mask 8 and the second hard mask 18 almost completely disappeared. The hard masks 8 and 18 on the exposed portions may remain after the etching stopper 5 on the upper surface of the first level interconnects 4a and 4b is completely removed. However, it is preferable to completely remove them by over-etching because parasitic capacitance between interconnects can be reduced.

Figure 27:
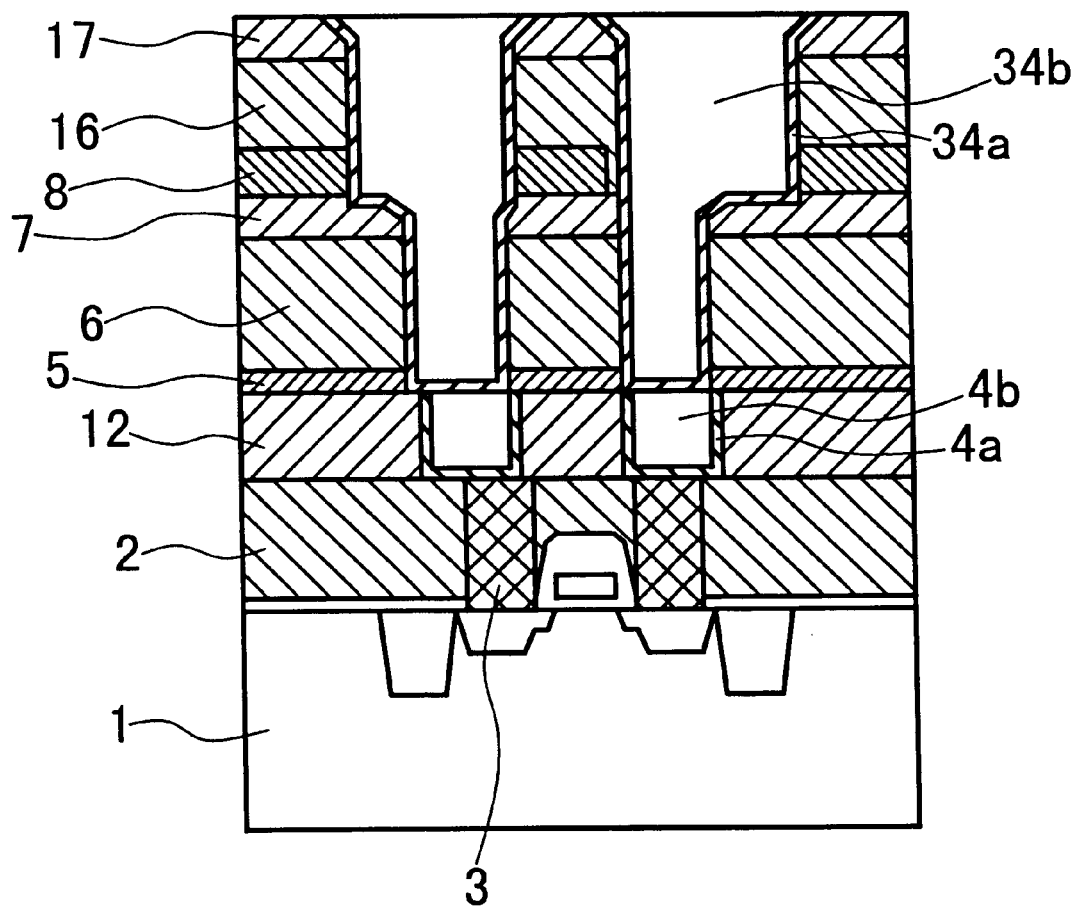
FIG. 27 is a cross-sectional view of a process for manufacturing the second embodiment of the present invention.

Further, as shown in FIG. 27, sputter-etching was performed for 20 nm as measured using blanket silicon oxide film, and titanium nitride and copper were thinly formed by sputtering. Then, by copper plating, layered films of a barrier metal film 34a comprising titanium nitride and a copper film 34b were buried in the hole and the trench. Further, by chemical-mechanical polishing, titanium nitride and copper outside the hole and the trench were removed. Consequently, vias 34a and 34b, and interconnects 34a and 34b were fabricated in the layered films.

On the multi-level interconnects of the Example 2 thus prepared, the yield was evaluated. As a result, via connection yield of 0.25 μm diameter vias and insulation yield of 0.25 μm spacing interconnects were both 95% or more, and no decrease of yield due to faceting was observed.

Figure 14:
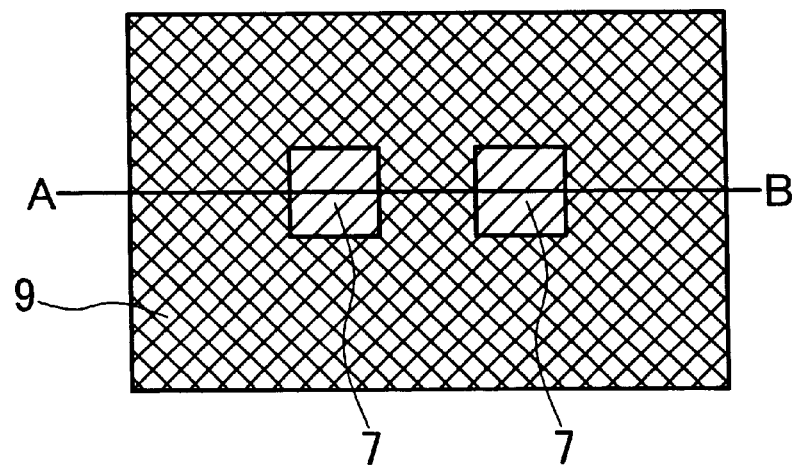
FIG. 14 is a plan view showing a process for manufacturing the first embodiment of the present invention.

Further, by repeating the process from FIG. 12 to FIG. 14 of Example 1 and the process from FIG. 22 to FIG. 27 of Example 2, 3-level interconnects were formed, and capacitance between adjacent interconnects of the second level interconnects was measured. Effective dielectric constant of the adjacent wires thus obtained was 3.6. The increase of effective dielectric constant compared with Example 1 is attributed to the fact that the silicon nitride film 8 for the first hard mask of 100 nm in thickness remains in the inter-level dielectrics.

Example 3

FIG. 28 to FIG. 36 each represents a cross-sectional view or a plan view of a manufacturing process of a semiconductor device in Example 3 of the present invention where dual damascene process is applied for formation of multi-level interconnects. In this example, the processes from FIG. 9 to FIG. 12 are the same as in Example 1.

Figure 28:
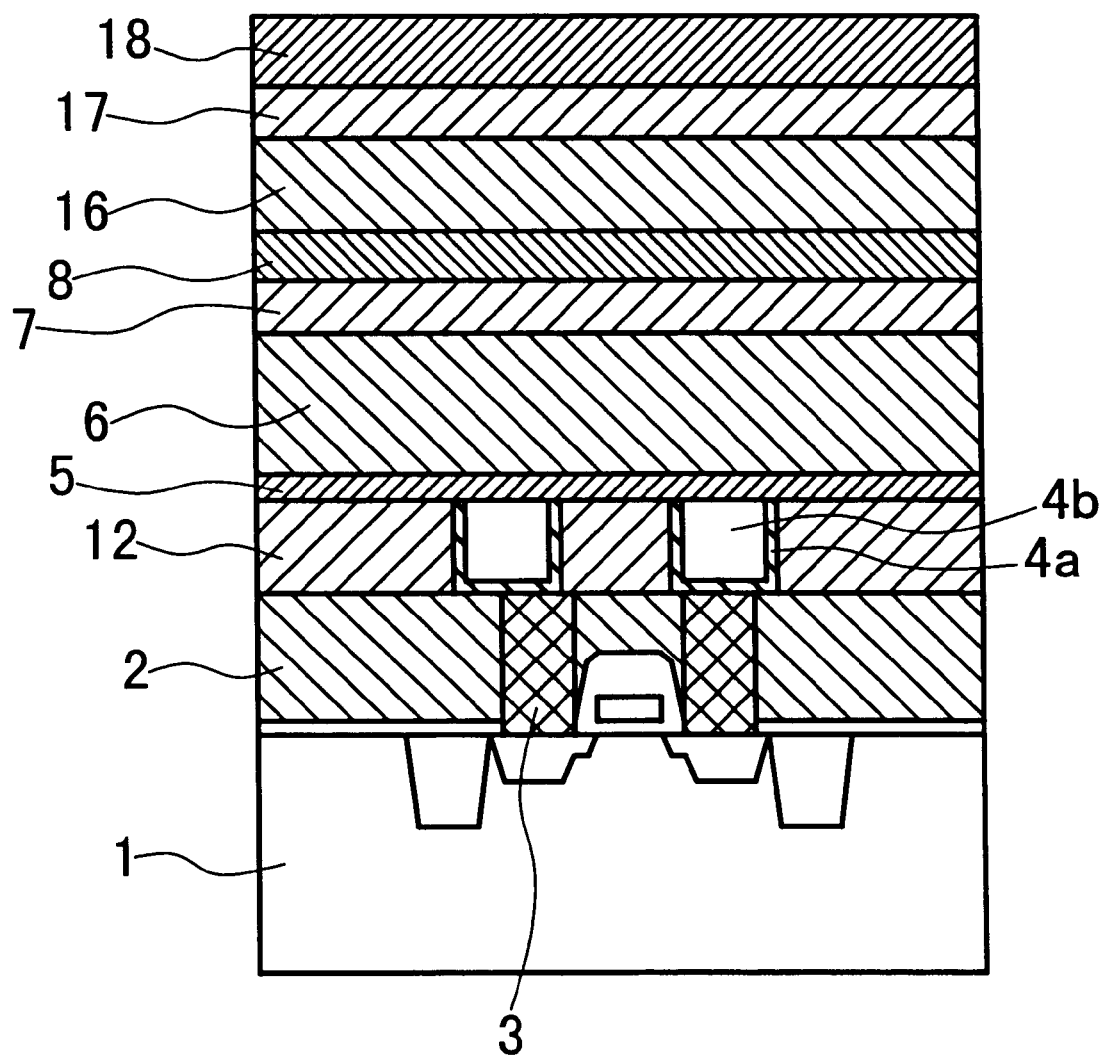
FIG. 28 is a cross-sectional view of a process for manufacturing a third embodiment of the present invention.

After the process of FIG. 12, as shown in FIG. 28, a second organic SOG film 16 was coated in thickness of 200 nm as a methylsiloxane film 16, and this was cured in nitrogen ambient at 425° C. Further, by plasma CVD method, a second silicon oxide film 17 was formed in thickness of 100 nm, and a silicon nitride film was formed in thickness of 100 nm as a second hard mask 18.

Figure 29:
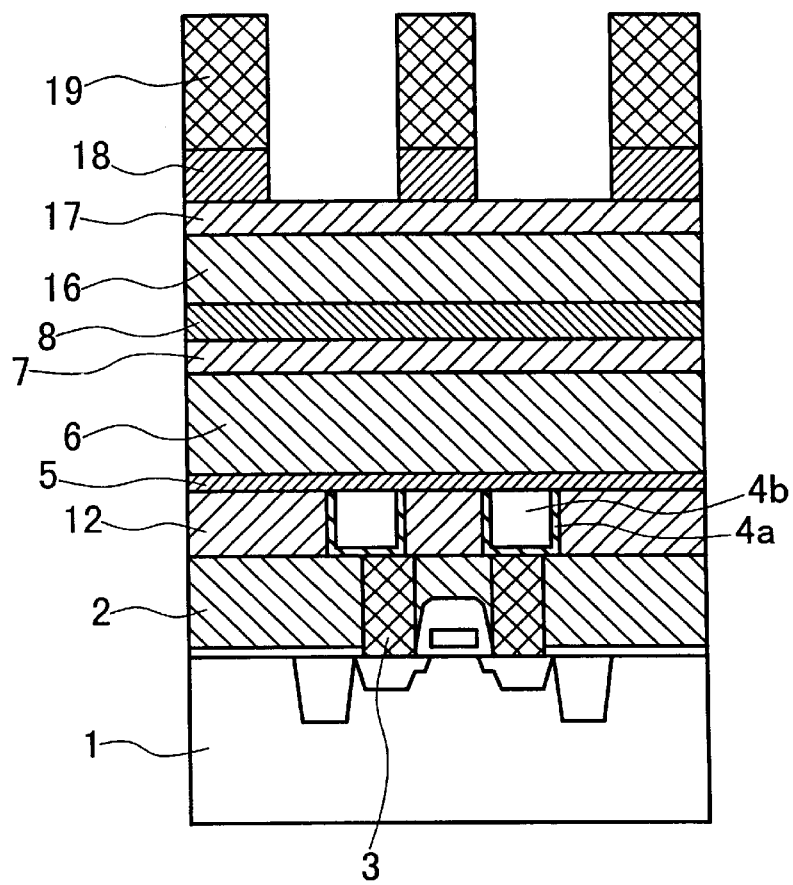
FIG. 29 is a cross-sectional view of a process for manufacturing the third embodiment of the present invention.
Figure 30:
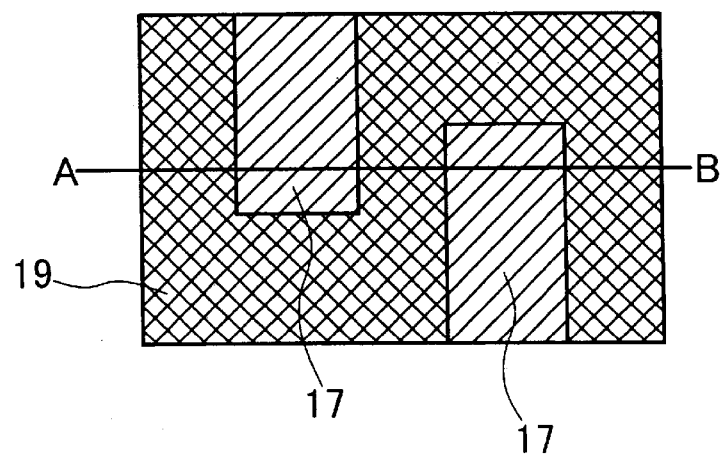
FIG. 30 is a plan view of a process for manufacturing the third embodiment of the present invention.

Next, as shown in FIG. 29, reactive ion etching was performed using a first resist 19 as mask, and the pattern of the second level interconnects was transferred to the second hard mask 18. In this etching process, it is necessary to stop the etching in the second silicon oxide film 17 without exposing the second organic SOG film 16 as shown in the plan view of FIG. 30. There is no need to stop the etching exactly on the upper surface of the second silicon oxide film 17 as shown in FIG. 29. The second silicon oxide film 17 may be removed to some extent if the second organic SOG film 16 is not exposed.

Figure 31:
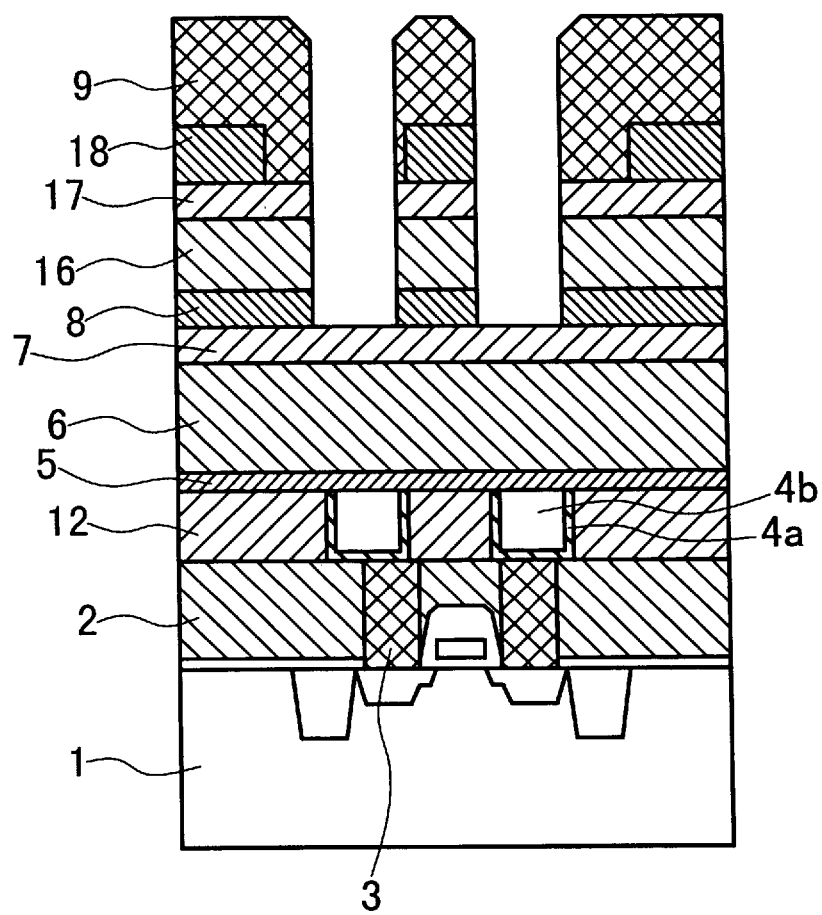
FIG. 31 is a cross-sectional view of a process for manufacturing the third embodiment of the present invention.
Figure 32:
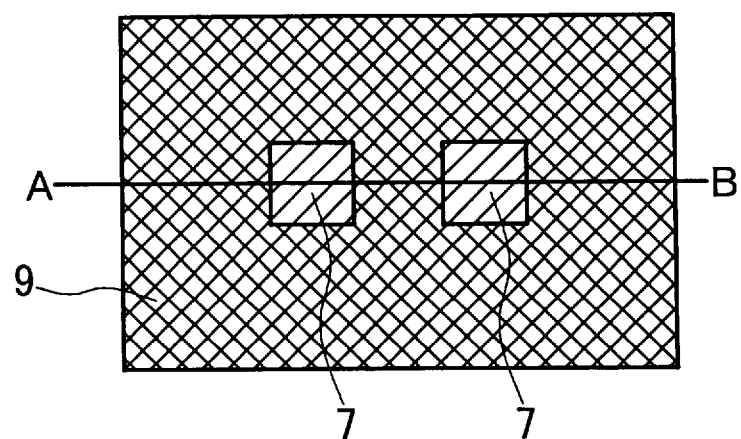
FIG. 32 is a plan view of a process for manufacturing the third embodiment of the present invention.

Next, as shown in FIG. 31, the first resist 19 was removed by ICP type asher, and the second resist 9 was formed and patterned using lithography. Then, via hole pattern was transferred to the second silicon oxide film 17 and the second organic SOG film 16. In this etching process, it is necessary to etch the first hard mask completely. There is no need to stop the etching exactly on the upper surface of the first silicon oxide film 7 in FIG. 31, and the first silicon oxide film 7 and the first organic SOG film 6 may be etched to some extent.

Figure 33:
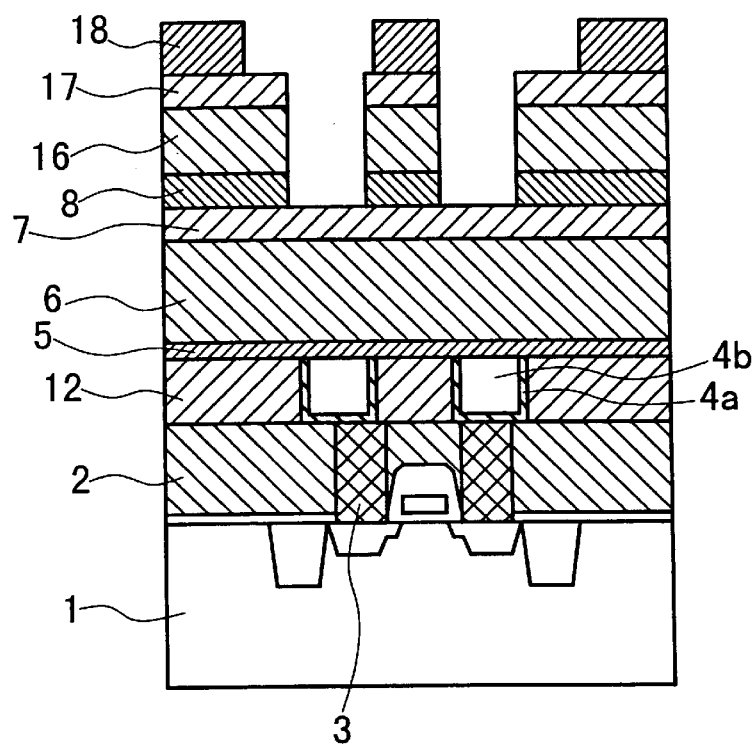
FIG. 33 is a cross-sectional view of a process for manufacturing the third embodiment of the present invention.

Next, as shown in FIG. 33, low-pressure reactive ion etching was performed using oxygen at the pressure of 10 mTorr, and the second resist 9 was removed. Under this condition, aspect ratio of the hole formed in the second organic SOG film 16 and the second silicon oxide film 17 was 3 or less in a hole pattern of 0.25 μm in diameter. By removing the second resist 9 at low pressure, the quality deterioration did not occur in the second organic SOG film 16.

Figure 34:
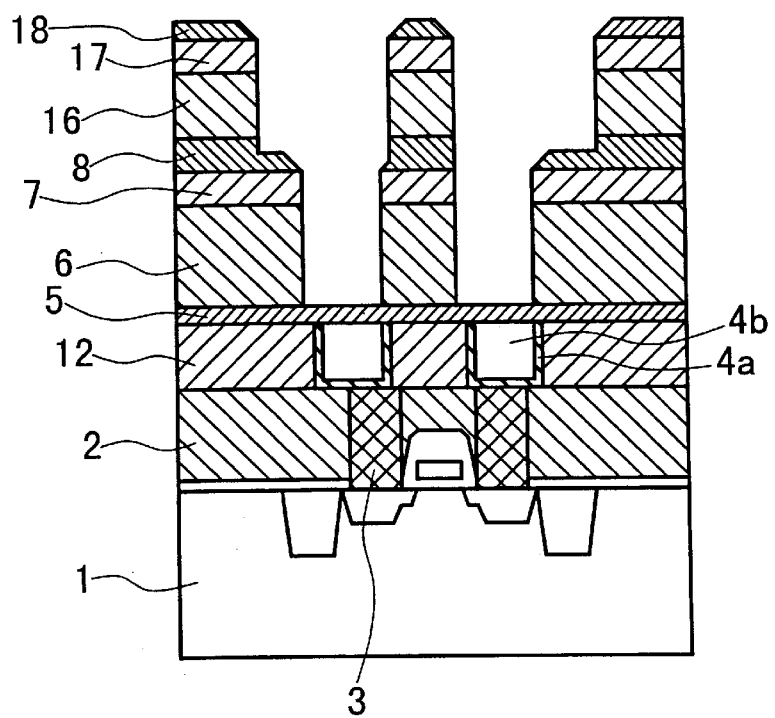
FIG. 34 is a cross-sectional view of a process for manufacturing the third embodiment of the present invention.

Further, as shown in FIG. 34, reactive ion etching was performed using the second silicon nitride film 18 and the first silicon nitride film 8 as hard mask, and etching was performed on the first silicon oxide film 7 and the second silicon oxide film 17 as well as the first organic SOG film 6 and the second organic SOG film 16. In this etching process, etching selectivity of the silicon oxide film and the organic SOG to silicon nitride was 10. By this etching process, film thickness of the exposed portions of the first hard mask 8 and the second hard mask 18 was turned to 60 nm. As a result, via-holes were formed in the layered films of the first organic SOG film 6 and the first silicon oxide film 7. Also, trench was formed in the layered films of the second organic SOG film 16 and the second silicon oxide film 17.

Figure 35:
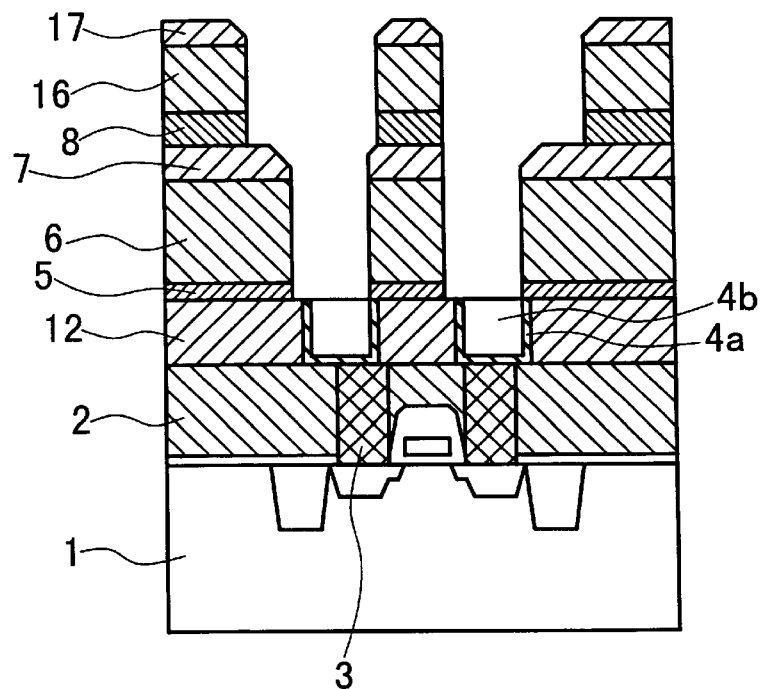
FIG. 35 is a cross-sectional view of a process for manufacturing the third embodiment of the present invention.

Next, as shown in FIG. 35, the surface of the holes and the trenches were cleaned using wet solution, and etching was performed on the etching stopper 5. In this case, exposed portions of the first hard mask 8 and the second hard mask 18 disappeared almost completely. If upper surfaces of the first level interconnects 4a and 4b are exposed, there is no problem even when the hard masks 8 and 18 of the exposed portions may remain. However, if it is completely removed, it is possible to reduce parasitic capacitance between the interconnects.

Figure 36:
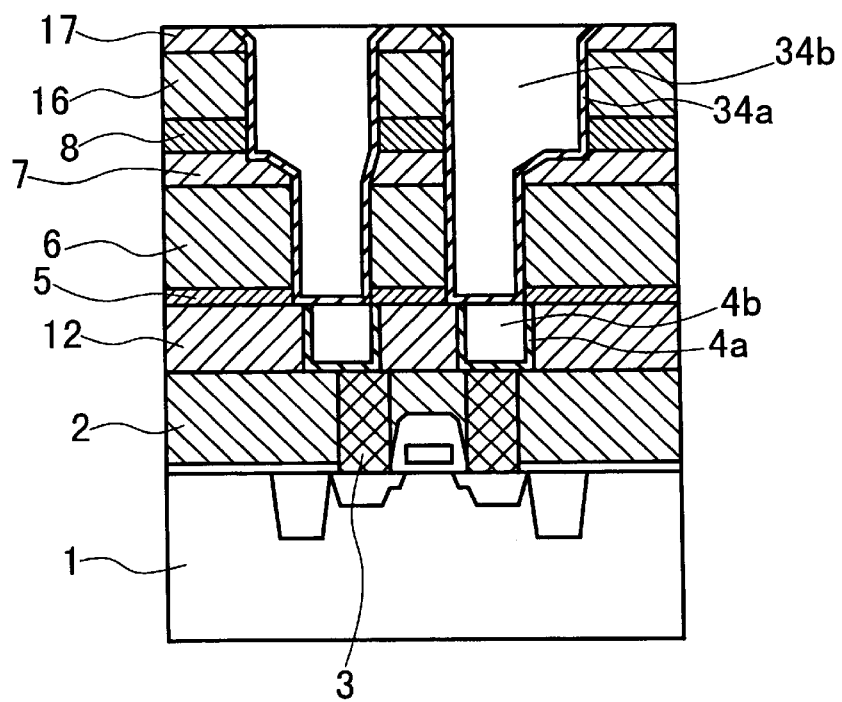
FIG. 36 is a cross-sectional view of a process for manufacturing the third embodiment of the present invention.

Further, as shown in FIG. 36, sputter-etching was performed for the time as long as a 20-nm-thick blanket silicon oxide film is removed, and titanium nitride and copper were formed thinly by sputtering. Then, by copper plating, layered films of a barrier metal film 34a comprising titanium nitride and a copper film 34b were buried in the hole and the trench. Further, by chemical-mechanical polishing, titanium nitride outside the hole and the trench were removed. Consequently, vias 34a and 34b, and interconnects 34a and 34b were fabricated in the layered films.

On the multi-level interconnects of Example 3 thus prepared, the yield was evaluated. As a result, via connection yield of 0.25 µm diameter vias and insulation yield of 0.25 µm spacing interconnects were both 95% or more, and no decrease of yield due to faceting was observed.

In the above examples, description has been given on the case where titanium nitride was used as barrier metal film, while the invention is not limited to these examples, and film of nitride of refractory metal such as tantalum nitride, tungsten nitride, etc. may be used.

According to the present invention, it is possible to prevent via-connection failure and short failure in multi-level interconnects.

The foregoing invention has been described in terms of preferred embodiments. However, those skilled, in the art will recognize that many variations of such embodiments exist. Such variations are intended to be within the scope of the present invention and the appended claims.

What is claimed is:

1. A method for manufacturing a semiconductor device, comprising:
    a first process for forming an etching stopper on a first conductor film;
    a second process for forming a methylsiloxane type film on or over said etching stopper;
    a third process for forming an insulating film different from the methylsiloxane type film on the methylsiloxane type film;
    a fourth process for forming a hard mask on the insulating film;
    a fifth process for transferring a pattern to the hard mask using a photoresist mask, and removing the photoresist mask;
    a sixth process for partially removing layered films of said methylsiloxane type film and said insulating film using the hard mask as a mask;
    a seventh process for partially removing said etching stopper for exposing a part of said first conductor film and for removing said hard mask; and
    an eighth process for forming a second conductor film electrically connected with said first conductor film on a recess of said layered films formed in said sixth process.

2. A method for manufacturing a semiconductor device according to claim 1, wherein an etching rate of said insulating film is ⅓ or less of an etching rate of the hard mask.

3. A method for manufacturing a semiconductor device according to claim 2, wherein said insulating film is a silicon oxide film.

4. A method for manufacturing a semiconductor device according to claim 1, wherein said methylsiloxane type film is an organic SOG film.

5. A method for manufacturing a semiconductor device according to claim 1, wherein said hard mask is a silicon nitride film or a silicon carbide film.

6. A method for manufacturing a semiconductor device according to claim 1, wherein said etching stopper is a silicon nitride film or a silicon carbide film.

7. A method for manufacturing a semiconductor device according to claim 1, wherein said first and said second conductor films are layered films of a barrier metal film and a copper film.

8. A method for manufacturing a semiconductor device according to claim 7, wherein said barrier metal film is a titanium nitride film or a tantalum nitride film.

9. A method for manufacturing a semiconductor device according to claim 1, wherein said first conductor film forms a via for interconnection, and said second conductor film forms a wiring for interconnection.

10. A method for manufacturing a semiconductor device according to claim 1, wherein said first conductor film forms a wiring for interconnection, and said second conductor film forms a via for interconnection.

11. A method for manufacturing a semiconductor device, comprising:
    a first process for forming an etching stopper on a first conductor film;
    a second process for forming a first methylsiloxane type film on or over said etching stopper;
    a third process for forming a first insulating film different from the methylsiloxane type film on said first methylsiloxane type film;
    a fourth process for forming a first hard mask on said first insulating film;
    a fifth process for transferring a hole pattern to said first hard mask using a first photoresist mask, and removing said first photoresist mask;
    a sixth process for forming a second methylsiloxane type film on said first hard mask;
    a seventh process for forming a second insulating film different from the methylsiloxane type film on said second methylsiloxane type film;
    an eighth process for forming a second hard mask on said second insulating film;
    a ninth process for transferring a trench pattern having in-plane overlapping with said hole pattern to said second hard mask using a second photoresist mask, and removing said second photoresist mask;
    a tenth process for forming a trench in layered films of said second methylsiloxane type film and said second insulating film using said first and said second hard masks as masks, and forming a hole in layered films of said first methylsiloxane type film and said first insulating film;

an eleventh process for partially removing said etching stopper for exposing a part of said first conductor film and for removing said second hard mask; and a twelfth process for forming a second conductor film electrically connected with said first conductor film inside said trench and said hole formed in said tenth and eleventh processes.

12. A method for manufacturing a semiconductor device according to claim 11, wherein said first and said second insulating films have etching rate of $1/3$ or less of those of said first and second hard masks.

13. A method for manufacturing a semiconductor device according to claim 11, wherein said first and said second insulating films are silicon oxide films.

14. A method for manufacturing a semiconductor device according to claim 11, wherein said first and second methylsiloxane type films are organic SOG films.

15. A method for manufacturing a semiconductor device according to claim 11, wherein each of said first and second hard masks is a silicon nitride film or silicon carbide film.

16. A method for manufacturing a semiconductor device according to claim 11, wherein said etching stopper is a silicon nitride film or a silicon carbide film.

17. A method for manufacturing a semiconductor device according to claim 11, wherein said first and second conductor films are layered films of a barrier metal film and a copper film.

18. A method for manufacturing a semiconductor device according to claim 17, wherein said barrier metal film is a titanium nitride film or a tantalum nitride film.

19. A method for manufacturing a semiconductor device according to claim 11, wherein said second conductor film in said hole forms a via for interconnection, and said second conductor film in said trench forms a second level wiring for interconnection.

20. A method for manufacturing a semiconductor device, comprising:

forming an etching stopper on a first conductor film;

forming a methylsiloxane type film on or over said etching stopper;

forming an insulating film different from the methylsiloxane type film on the methylsiloxane type film;

forming a hard mask on the insulating film;

transferring a pattern to the hard mask using a photoresist mask, and removing the photoresist mask;

partially removing layered films of said methylsiloxane type film and said insulating film using the hard mask as a mask;

partially removing said etching stopper, so as to expose a part of said first conductor film, and removing said hard mask; and forming a second conductor film electrically connected with said first conductor film on a recess of said layered films formed by said partial removing of said layered films.

21. A method for manufacturing a semiconductor device according to claim 20, wherein an etching rate of said insulating film is $1/3$ or less of an etching rate of the hard mask.

22. A method for manufacturing a semiconductor device according to claim 21, wherein said insulating film is a silicon oxide film.

23. A method for manufacturing a semiconductor device according to claim 20, wherein said methylsiloxane type film is an organic SOG film.

24. A method for manufacturing a semiconductor device according to claim 20, wherein said hard mask is a silicon nitride film or a silicon carbide film.

25. A method for manufacturing a semiconductor device according to claim 20, wherein said etching stopper is a silicon nitride film or a silicon carbide film.

26. A method for manufacturing a semiconductor device according to claim 20, wherein said first and said second conductor films are layered films of a barrier metal film and a copper film.

27. A method for manufacturing a semiconductor device according to claim 26, wherein said barrier metal film is a titanium nitride film or a tantalum nitride film.

28. A method for manufacturing a semiconductor device according to claim 20, wherein said first conductor film forms a via for interconnection, and said second conductor film forms a wiring for interconnection.

29. A method for manufacturing a semiconductor device according to claim 20, wherein said first conductor film forms a wiring for interconnection, and said second conductor film forms a via for interconnection.

30. A method for manufacturing a semiconductor device, comprising:

forming an etching stopper on a first conductor film;

forming a first methylsiloxane type film on or over said etching stopper;

forming a first insulating film different from the methylsiloxane type film on said first methylsiloxane type film;

forming a first hard mask on said first insulating film;

transferring a hole pattern to said first hard mask using a first photoresist mask, and removing said first photoresist mask;

forming a second methylsiloxane type film on said first hard mask;

forming a second insulating film different from the methylsiloxane type film on said second methylsiloxane type film;

forming a second hard mask on said second insulating film;

transferring a trench pattern having in-plane overlapping with said hole pattern to said second hard mask using a second photoresist mask, and removing said second photoresist mask;

forming a trench in layered films of said second methylsiloxane type film and said second insulating film using said first and said second hard masks as masks, and forming a hole in layered films of said first methylsiloxane type film and said first insulating film;

partially removing said etching stopper, so as to expose a part of said first conductor film, and removing said second hard mask; and forming a second conductor film electrically connected with said first conductor film inside said trench and said hole.

31. A method for manufacturing a semiconductor device according to claim 30, wherein said first and said second insulating films have etching rate of $1/3$ or less of those of said first and second hard masks.

32. A method for manufacturing a semiconductor device according to claim 30, wherein said first and said second insulating films are silicon oxide films.

33. A method for manufacturing a semiconductor device according to claim 32, wherein said first and second methylsiloxane type films are organic SOG films.

34. A method for manufacturing a semiconductor device according to claim 30, wherein each of said first and second hard masks is a silicon nitride film or silicon carbide film.

35. A method for manufacturing a semiconductor device according to claim 30, wherein said etching stopper is a silicon nitride film or a silicon carbide film.

36. A method for manufacturing a semiconductor device according to claim 30, wherein said first and second conductor films are layered films of a barrier metal film and a copper film.

37. A method for manufacturing a semiconductor device according to claim 36, wherein said barrier metal film is a titanium nitride film or a tantalum nitride film.

38. A method for manufacturing a semiconductor device according to claim 30, wherein said second conductor film in said hole forms a via for interconnection, and said second conductor film in said trench forms a second level wiring for interconnection.

* * * * *